US 6,683,515 B1

(12) United States Patent
Nakamura et al.

(10) Patent No.: US 6,683,515 B1
(45) Date of Patent: Jan. 27, 2004

(54) SURFACE-ACOUSTIC-WAVE FILTER PROVIDING OUTPUTS WITH DIFFERENT DELAY TIMES AND COMMUNICATIONS UNIT

(75) Inventors: Hiroyuki Nakamura, Katano (JP); Kenji Monma, Neyagawa (JP); Toru Yamada, Katano (JP); Kazunori Nishimura, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 173 days.

(21) Appl. No.: 09/666,814

(22) Filed: Sep. 21, 2000

(30) Foreign Application Priority Data

Sep. 22, 1999 (JP) ......................................... H11-269284

(51) Int. Cl.⁷ ............................ H03H 9/64; H03H 9/42; H04B 1/18; H04B 7/08
(52) U.S. Cl. ..................... 333/193; 333/150; 333/153; 333/133; 455/272; 455/276.1
(58) Field of Search .................. 333/193–196, 333/153, 150, 152, 133; 455/269, 272, 275, 276.1

(56) References Cited

U.S. PATENT DOCUMENTS

| | | | | |
|---|---|---|---|---|
| 3,845,420 A | * | 10/1974 | Holland et al. ............... 333/153 |
| 3,908,137 A | * | 9/1975 | Hunsinger et al. ...... 333/152 X |
| 3,952,269 A | * | 4/1976 | Bristol ........................ 333/153 |
| 4,583,047 A | * | 4/1986 | Le Goff épouse Hénaff et al. ....................... 333/193 X |
| 4,682,174 A | | 7/1987 | Richmond et al. .......... 342/160 |
| 5,434,893 A | * | 7/1995 | Le Roy et al. .............. 375/208 |
| 5,563,610 A | * | 10/1996 | Reudink ..................... 342/375 |
| 6,229,840 B1 | * | 5/2001 | Ichihara ...................... 375/147 |
| 6,275,482 B1 | * | 8/2001 | Jevremovic et al. ........ 370/334 |

FOREIGN PATENT DOCUMENTS

JP          50-17951          2/1975

OTHER PUBLICATIONS

Japanese Office Action for JP 2000–285859 mailed Apr. 1, 2003 (w/ partial English translation).

* cited by examiner

Primary Examiner—Barbara Summons
(74) Attorney, Agent, or Firm—RatnerPrestia

(57) ABSTRACT

A surface-acoustic-wave filter has a piezoelectric substrate; and a plurality of transversal surface-acoustic-wave (SAW) filters set on the piezoelectric substrate and respectively having at least two inter-digital transducer (IDT) electrodes for transcieving surface acoustic waves, characterized in that periods for surface acoustic waves to propagate from inputs to outputs of the SAW filters differ in the SAW filters and thereby, timings of outputs from the SAW filters are different from each other.

16 Claims, 9 Drawing Sheets

US 6,683,515 B1

SURFACE-ACOUSTIC-WAVE FILTER PROVIDING OUTPUTS WITH DIFFERENT DELAY TIMES AND COMMUNICATIONS UNIT

BACKGROUND OF THE INVENTION

1. Field of the Invention

The present invention relates to a surface-acoustic-wave filter using a transversal SAW filter used for a high-frequency circuit of a radio communication unit.

2. Related Art of the Invention

A surface-acoustic-wave filter has been frequently used so far as a RF- or IF-stage filter of a transceiving circuit of a communication unit. Particularly recently, a portable telephone according to a mode referred to as CDMA (Code Division Multiple Access) has been positively developed as a next-generation mobile communication system.

The CDMA communication mode allows the so-called RAKE reception for improving the sensitivity by synthesizing delay waves of a multipath.

A CDMA receiving circuit is described below by referring to the accompanying drawings.

FIG. 9 is an illustration showing the outline of a CDMA receiving circuit. In FIG. 9, symbol 702 denotes a demodulating section, 703a and 703b denote antennas, 704a and 704b denote filters, 705a and 705b denote amplifiers, 706a and 706b denote mixers, 707a and 707b denote transversal SAW filters, and 708 denotes a delay unit. In this case, the transversal SAW filters 707a and 707b are assumed as the same device.

Operations of the CDMA receiving circuit having the above configuration according to the prior art are described below. That is, a signal received by the antenna 703a passes through the filter 704a and amplifier 705a and is converted into an IF signal by the mixer 706a. When assuming the signal as an IF signal "a," the IF signal "a" passes through the transversal SAW filter 707a and is output to the demodulating section 702.

Similarly, a signal received by the antenna 703b passes through the filter 704b and amplifier 705b and is converted into an IF signal by the mixer 706b. When assuming the signal as an IF signal "b," the IF signal "b" passes through the transversal SAW filter 707b and delay unit 708 and is output to the demodulating section 702.

The demodulating section 702 performs RAKE reception by synthesizing the IF signal "a" and the IF signal "b" input by being delayed by the delay unit 708.

Operations of the CDMA receiving circuit are described above.

However, the above configuration has problems that a single delay unit is required for RAKE reception and thereby, the circuit size increases. Therefore, the CDMA receiving circuit cannot be applied to a compact portable terminal unit.

SUMMARY OF THE INVENTION

The present invention is made to solve the above problems and its object is to provide a surface-acoustic-wave filter capable of reducing the number of parts for signal delay and downsizing a receiving circuit, and a communication unit using the surface-acoustic-wave filter.

One aspect of the present invention is a surface-acoustic-wave filter, comprising:

a piezoelectric substrate; and a plurality of transversal surface-acoustic-wave (SAW) filters set on the piezoelectric substrate and respectively having at least two inter-digital transducer (IDT) electrodes for transceiving surface acoustic waves, characterized in that periods for surface acoustic waves to propagate from inputs to outputs of the SAW filters differ in the SAW filters and thereby, timings of outputs from the SAW filters are different from each other.

Another aspect of the present invention is a surface-acoustic-wave filter, comprising:

a piezoelectric substrate;

a plurality of filters set on the piezoelectric substrate and respectively having at least two inter-digital transducer (IDT) electrodes for transceiving surface acoustic waves; and a plurality of impedance-matching circuits connected to input sides and output sides of the filters, characterized in that output timings of output-side impedance-matching circuits of the filters are different from each other.

Still another aspect of the present invention is a communication unit using a CDMA mode, comprising:

receiving means provided with;

a plurality of antennas, a plurality of mixers for converting signals sent from the antennas into IF signals, a plurality of surface-acoustic-wave (SAW) filters for passing the IF signals, and a demodulating section for demodulating the IF signals, wherein said surface-acoustic-wave filter is used for the SAW filters.

According to the above configuration, a surface-acoustic-wave filter of the present invention is characterized by having transversal SAW filters corresponding to a plurality of reception signals, making group delay times of the transversal SAW filters different from each other, and thereby providing a group delay time difference for IF signals output from the SAW filters and makes it possible to downsize a CDMA receiving circuit by including a delay-unit function in the surface-acoustic-wave filter and reducing the number of parts of the CDMA receiving circuit in accordance with the above configuration.

| Description of Symbols | |
|---|---|
| 101 | Single-crystal piezoelectric substrate |
| 102, 103 | Transversal SAW filter |
| 104, 105, 106, 107 | IDT electrode |
| 201 | SAW filter package |
| 202 | Demodulating section |
| 203a, 203b, 203c | Antenna |
| 204a, 204b, 204c | Filter |
| 205a, 205b, 205c | Amplifier |
| 206a, 206b, 206c | Mixer |
| 301 | Strip electrode |
| 401 | Metallic film |
| 501a, 501b, 502a, 502b | Impedance-matching circuit |
| 601a, 601b, 601c, 601d | Capacitor |
| 602a, 602b, 602c, 602d | Capacitor |
| 702 | Demodulating section |
| 703a, 703b | Antenna |
| 704a, 704b | Filter |
| 705a, 705b | Amplifier |
| 706a, 706b | Mixer |
| 707a, 707b | Transversal SAW filter |
| 708 | Delay unit |

DETAILED DESCRIPTION OF THE PREFERRED EMBODIMENTS

Embodiments of the present invention are described below by referring to the accompanying drawings.

Embodiment 1

Figure 1:
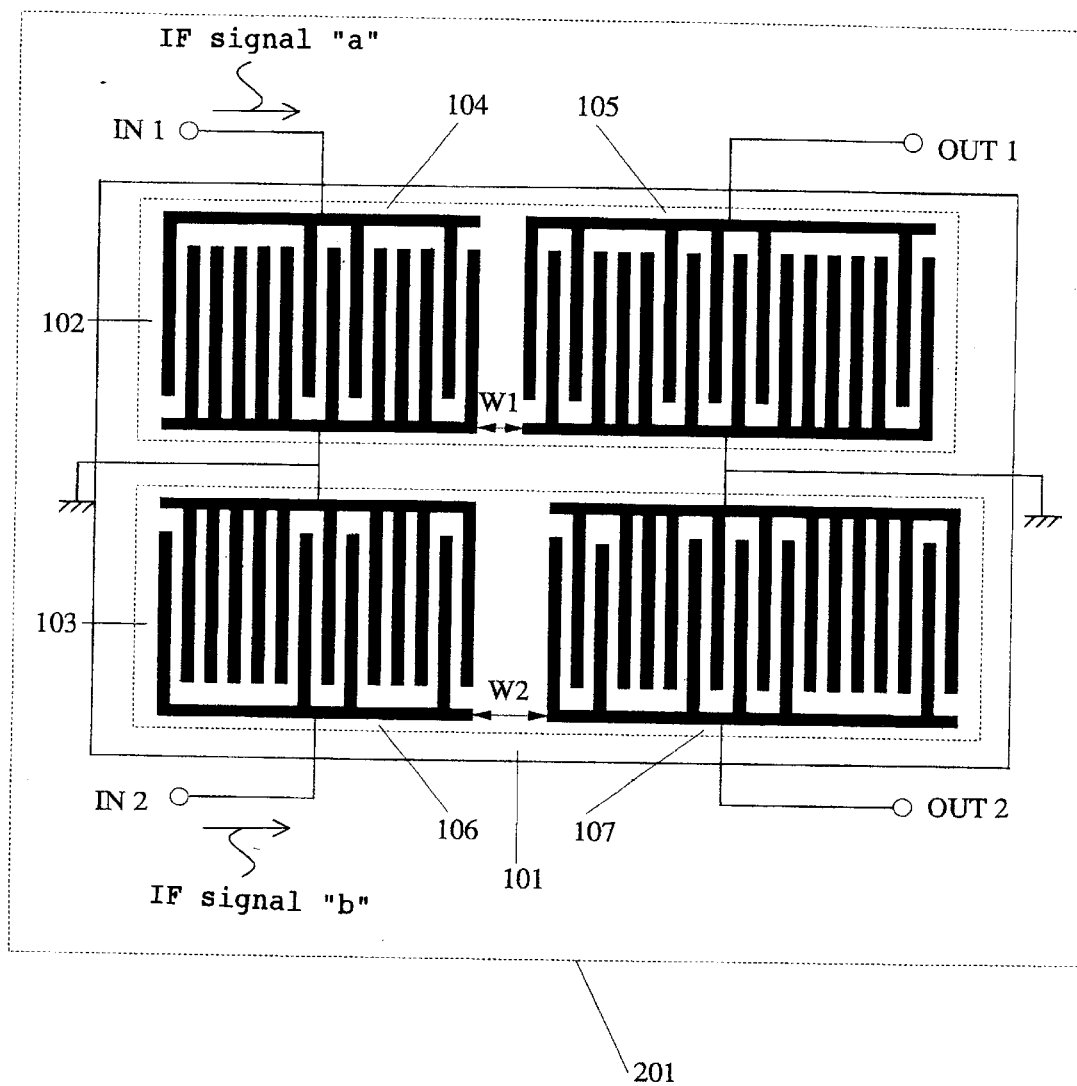
FIG. 1 is an illustration showing a configuration of embodiment 1 of a surface-acoustic-wave filter of the present invention.

FIG. 1 is an illustration showing a configuration of a surface-acoustic-wave filter of embodiment 1 of the present invention. In FIG. 1, symbol 101 denotes a single-crystal piezoelectric substrate. A surface acoustic wave is excited by forming an electrode pattern on the substrate. Symbol 104 denotes a wave-transmission-side IDT electrode and 105 denotes a wave-reception-side IDT electrode. The IDT electrodes 104 and 105 are set separately from each other by a SAW propagation distance W1 to constitute a transversal SAW filter 102. Similarly, a wave-transmission-side IDT electrode 106 and a wave-reception-side IDT electrode 107 on the single-crystal piezoelectric substrate 101 are set separately from each other by a SAW propagation distance W2 (W2>W1) to constitute a transversal SAW filter 103. The transversal SAW filters 102 and 103 are stored in one package to constitute a SAW filter package 201.

It is preferable that the SAW 102 and SAW 103 substantially have the same frequency characteristic.

Figure 2:
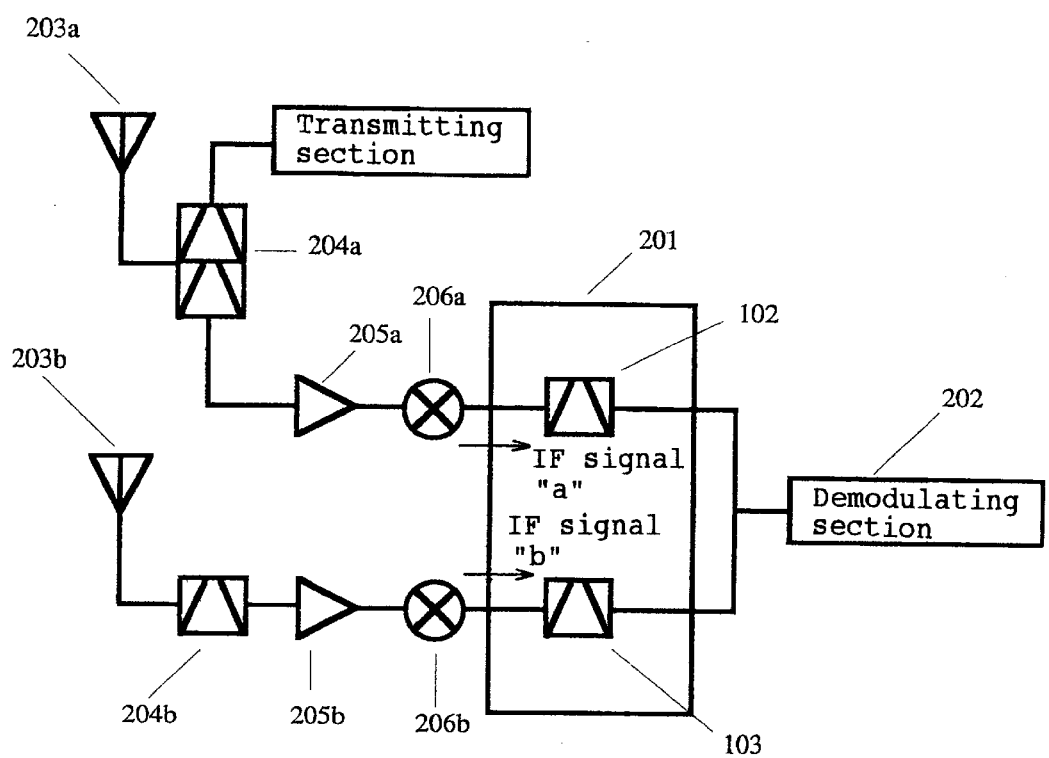
FIG. 2 is an illustration showing a CDMA receiving circuit using a surface-acoustic-wave filter of the present invention.
Figure 3:
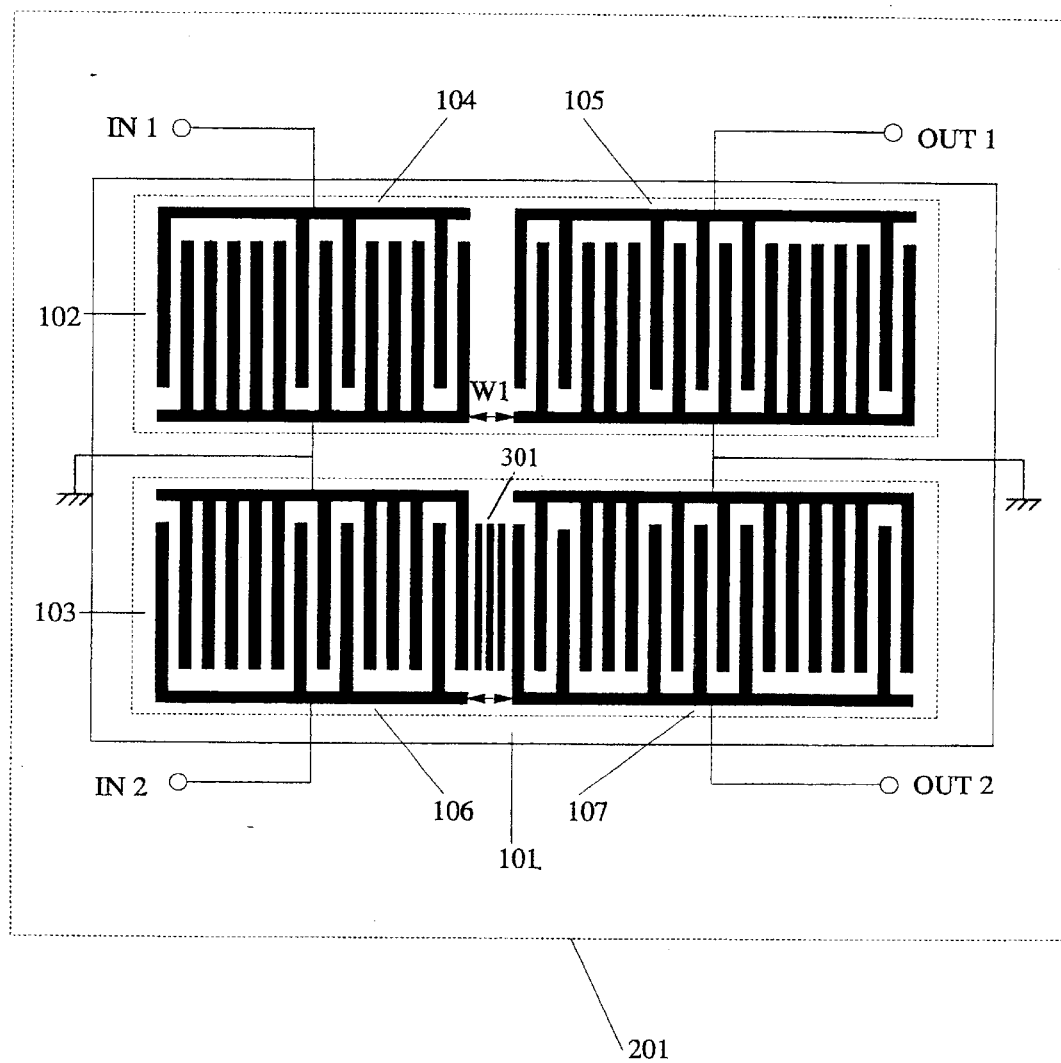
FIG. 3 is an illustration showing another configuration of the embodiment 1 of a surface-acoustic-wave filter of the present invention.
Figure 4:
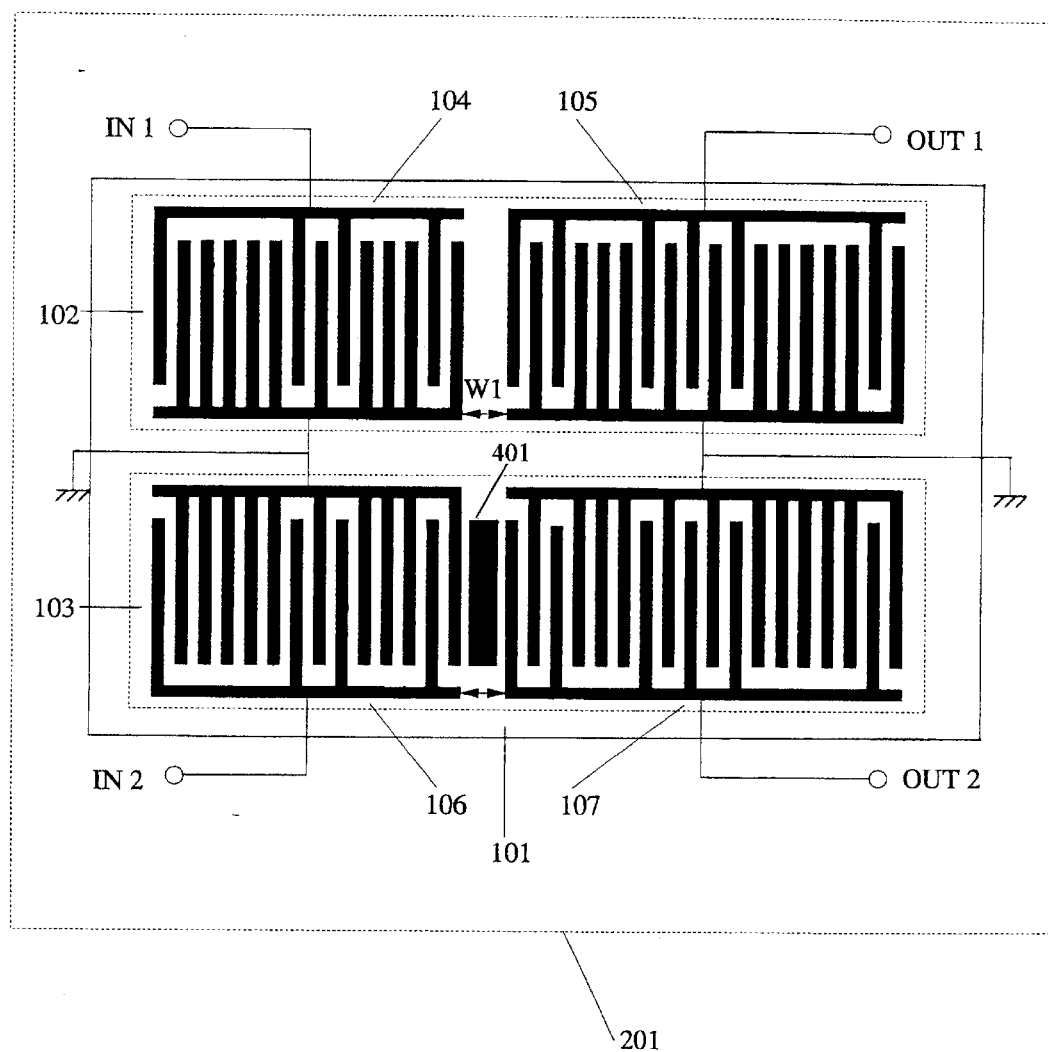
FIG. 4 is an illustration showing still another configuration of the embodiment 1 of a surface-acoustic-wave filter of the present invention.

FIG. 2 is an illustration showing the outline of a CDMA receiving circuit including a SAW filter package 201. In FIG. 2, symbol 202 denotes a demodulating section, 203a and 203b denote antennas, 204a and 204b denote filters, 205a and 205b denote amplifiers, and 206a and 206b denote mixers. Moreover, symbols 102 and 103 in the SAW filter 201 denote transversal SAW filters shown in FIG. 1.

A signal received by the antenna 203a passes through the filter 204a and amplifier 205a and is converted into an IF signal by the mixer 206a. When assuming the IF signal as an IF signal "a," the IF signal "a" is input to the transversal SAW filter 102 in the SAW filter package 201.

Similarly, a signal received by the antenna 203b passes through the filter 204b and amplifier 205b and is converted into an IF signal by the mixer 206b. When assuming the IF signal as an IF signal "b," the IF signal "b" is input to the transversal SAW filter 103 in the SAW filter package 201.

Operations of the surface-acoustic-wave filter of the embodiment 1 of the present invention are described below by referring to FIG. 1.

As described for the prior art, a CDMA receiver can perform RAKE reception in accordance with a method for receiving multipaths by using two receiving antennas. To improve the RAKE reception function, it is necessary to cause a group-delay-time difference between reception signals of the two systems.

The IF signal "a" is converted into a surface acoustic wave by the wave-transmission-side IDT electrode 104, propagates on the piezoelectric substrate 101 and enters the wave-reception-side IDT electrode 105 separate by the distance W1, and is reconverted into an electrical signal and output. At the same time, an IF signal is filtered by comb shapes of the IDT electrodes 104 and 105.

Similarly, the IF signal "b" is converted into a surface acoustic wave by the wave-transmission-side IDT electrode 106, propagates on the piezoelectric substrate 101 and enters the wave-reception-side IDT electrode 107 separate by the distance W2, and is reconverted into an electrical signal and output. At the same time, an IF signal is filtered by comb shapes of the IDT electrodes 106 and 107.

In this case, the IF signals "a" and "b" are input to the demodulating section 202 with a time difference equivalent to the distance difference W2−W1 when the signals propagate as surface acoustic waves.

In this case, a narrow-band CDMA communication mode is considered as an applied example of this embodiment. In the case of the narrow-band CDMA communication mode, radio waves are transmitted at a chip rate of 1.2288 Mcps. Therefore, to perform RAKE reception, a group delay time difference of 0.8 $\mu$sec or more is necessary between receiving systems.

For this embodiment, a case of using ST-quartz as the piezoelectric substrate 101 is considered. When assuming the acoustic velocity for a surface acoustic wave to propagate on the ST-quartz as 3159 m/s, the delay of 0.8 $\mu$sec can be realized by setting the SAW propagation distance difference W2−W1 to approx. 2.5 mm. Because generally a SAW filter for narrow-band CDMA has a design which needs a long electrode size in the propagation direction, sizes of a filter are not greatly changed due to the difference of 2.5 mm.

Moreover, because a chip rate is 4.096 Mcps in the case of a wide-band CDMA communication mode, a necessary group delay time reaches 0.24 $\mu$sec or more and the SAW propagation distance difference W2−W1 further decreases up to approx. 0.77 mm.

As described above, according to this embodiment, it is possible to generate a group delay time difference between reception signals serving as filter outputs by setting a difference between SAW propagation distances of SAW filters for filtering reception signals of a plurality of systems.

Figure 7:
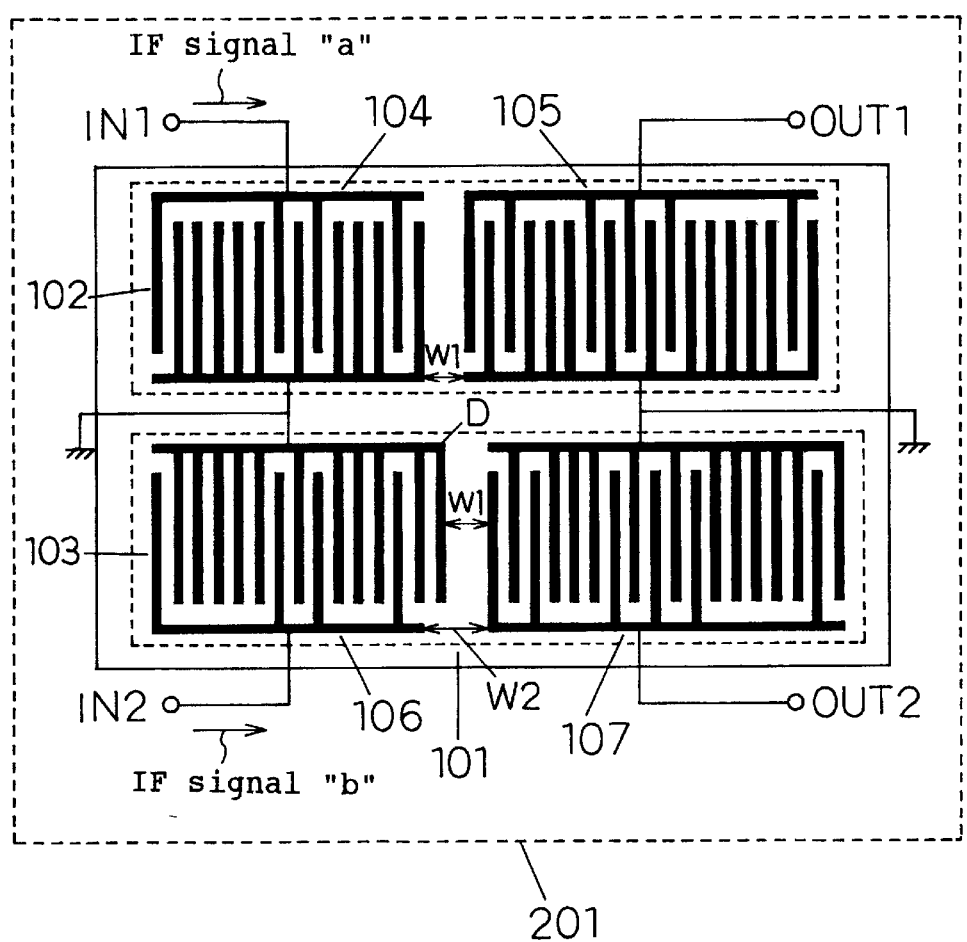
FIG. 7 is an illustration showing a configuration of a modification of the embodiment 1 of a surface-acoustic-wave filter of the present invention.

As shown in FIG. 7, even if a dummy electrode D is added and thereby propagation paths are the same (W1=W2), the influence due to addition of the dummy electrode is actually small and actual propagation distances of surface acoustic waves are still different (W1<W2). Therefore, it is possible to produce a group delay time difference.

Moreover, in the case of this embodiment, it is described to make the SAW propagation distance W2 larger than the SAW propagation distance W1 as a method for setting a group delay time difference between reception signals of two systems. When producing a group delay time difference by changing SAW speeds in a SAW propagation path, SAW propagation distances ate not always set so as to be W2>W1. A method for making the propagation speeds different from each other is optional.

For example, in the case of this embodiment, it is also permitted to set a metallic strip electrode 301 or a metallic film 401 to at least either of the SAW propagation path of the transversal SAW filter 102 (between the wave-transmission-side IDT electrode 104 and the wave-reception-side IDT electrode 105) and that of the transversal SAW filter 103 (between the wave-transmission-side IDT electrode 106 and wave-reception-side IDT electrode 107).

In this case, the speed of an SAW propagating in a SAW propagation path is lowered by the action of the strip electrode 301 or metallic film 401 and as a result, it is, possible to realize the same group delay time at a small propagation distance compared to the case in which no strip electrode is used and further downsize a surface-acoustic-wave filter.

Moreover, instead of setting either of a strip electrode and a metallic film on a SAW propagation path as described above, it is also possible to set both the strip electrode and the metallic film on the path. Furthermore, when setting a strip electrode or a metallic film to SAW propagation paths of a plurality of reception systems, it is possible to make speeds of SAWs propagating through SAW propagation paths different from each other by making shapes of strip electrodes or metallic films set to SAW propagation paths different from each other, and further precisely produce a group delay time difference between reception signals.

Moreover, it is also permitted to make SAW propagation distances different from each other and simultaneously make propagation speeds different from each other by using a strip electrode or the like. Thereby, it is possible to realize a further-precise group delay time.

Furthermore, this embodiment is described by assuming that the transversal SAW filters 102 and 103 are formed on the same piezoelectric substrate. However, it is also permitted to form these SAW filters on piezoelectric substrates different from each other and also in this case, the same advantage is obtained.

Furthermore, this embodiment is described by storing the transversal SAW filters 102 and 103 in one package. However, the same advantage is also obtained by forming these filters in different packages.

Figure 8:
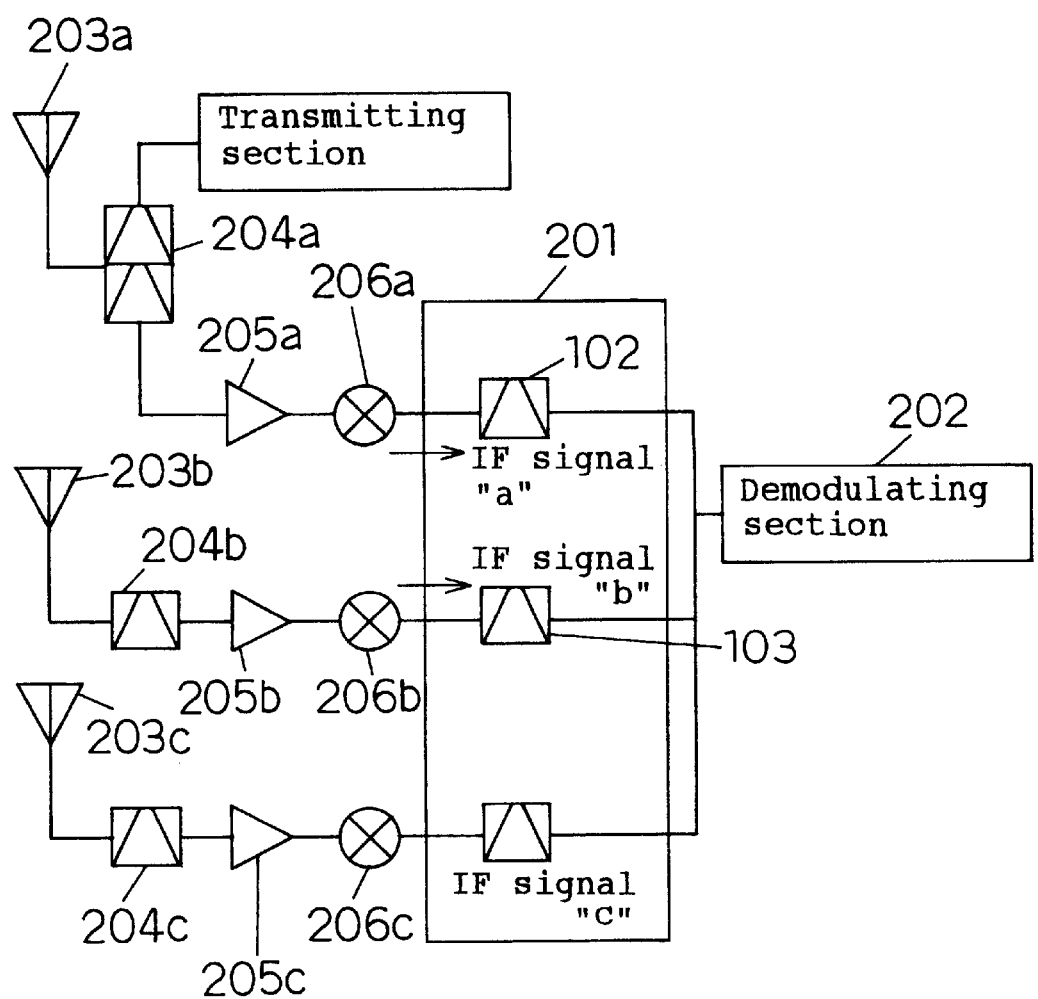
FIG. 8 is an illustration showing another CDMA receiving circuit using a surface-acoustic-wave filter of the present invention.
Figure 9:
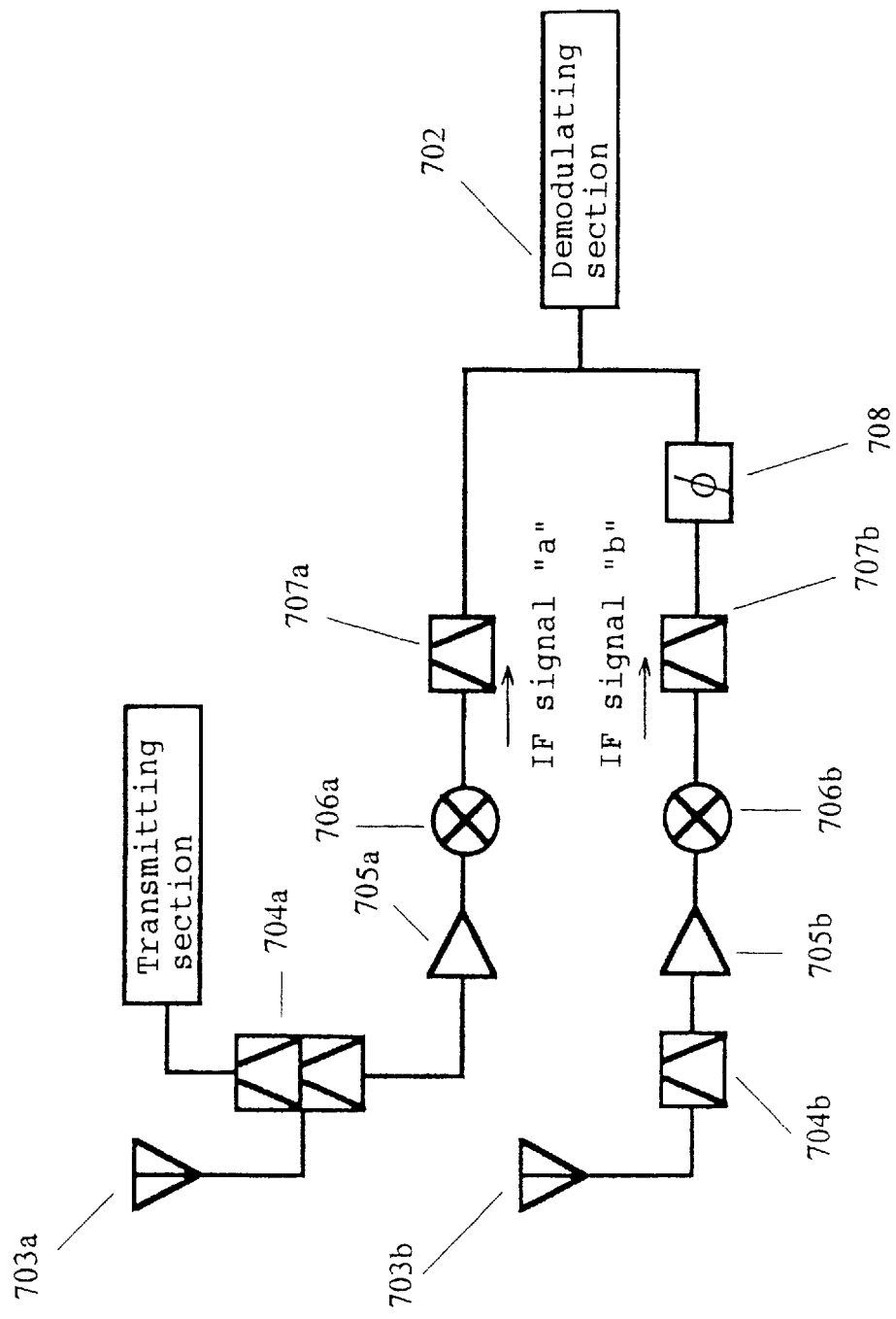
FIG. 9 is a block diagram of a CDMA receiving circuit using a surface-acoustic-wave filter of the prior art.

Furthermore, this embodiment is described by assuming that a CDMA receiving circuit has two receiving systems. However, as shown in FIG. 8, even when the circuit has three receiving systems or more, the same advantage is obtained by constituting transversal SAW filters equal to the number of receiving systems and making group delay times of SAW propagation paths different from each other in accordance with the above method (method of making SAW propagation distances different from each other or method of changing speeds of SAWs in SAW propagation paths).

Moreover, in the case of this embodiment, it is preferable that the transversal SAW filters 102 and 103 have almost the same frequency characteristic. That is, in the case of the present invention, it is preferable that weighting functions of the transversal SAW filters 102 and 103 are almost the same. For example, it is preferable that the weighting function of the wave-transmission-side IDT electrode 104 constituting the transversal SAW filter 102 and that of the wave-transmission-side IDT electrode 106 constituting the transversal SAW filter 103 are almost the same and moreover, the weighting function of the wave-reception-side IDT electrode 105 constituting the transversal SAW filter 102 and that of the wave-reception-side IDT electrode 107 constituting the transversal SAW filter 103 are almost the same.

Furthermore, it is possible to realize a more compact communication unit by mounting the surface-acoustic-wave filter described for this embodiment on a communication unit.

Embodiment 2

Figure 5:
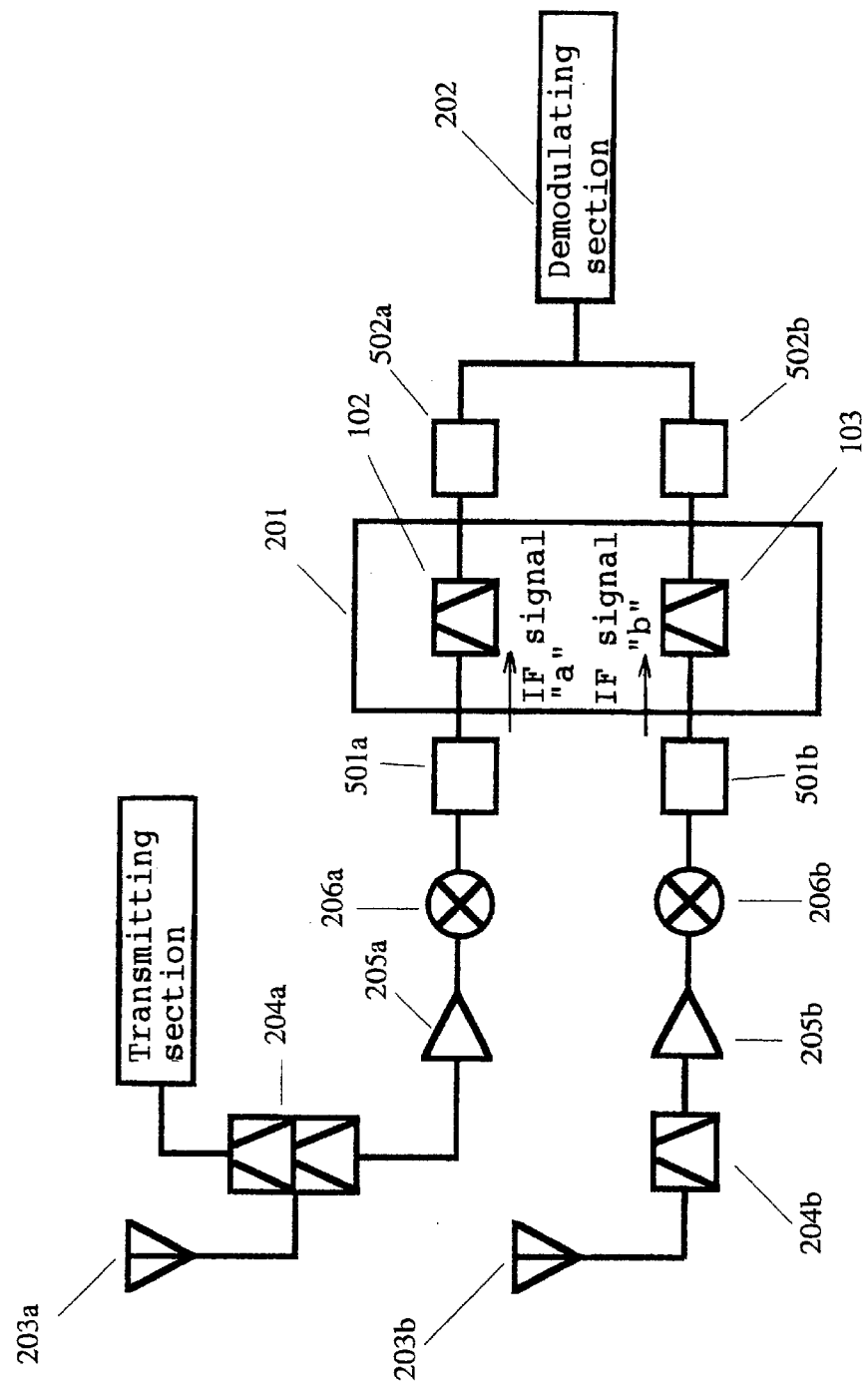
FIG. 5 is an illustration showing a CDMA receiving circuit having a configuration of embodiment 2 of a surface-acoustic-wave filter of the present invention.

FIG. 5 is an illustration showing a configuration of the surface-acoustic-wave filter of the embodiment 2 of the present invention. In FIG. 5, a component same as or corresponding to that in FIGS. 1, 2, and 7 is provided with the same symbol and its overlapped description is omitted. Moreover, in FIG. 5, symbols 501a, 501b, 502a, and 502b denote impedance-matching circuits. The impedance-matching circuit 501a matches the impedance of a mixer 206a with that of a transversal SAW filter 102 and the impedance-matching circuit 502a matches the impedance of a transversal SAW filter 102 with that of a demodulating section 202.

Similarly, the impedance-matching circuit 501b matches the impedance of the mixer 206b with that of a transversal SAW filter 103 and the impedance-matching circuit 502b matches the impedance of the transversal SAW filter 103 with that of the demodulating section 202.

Figure 6:
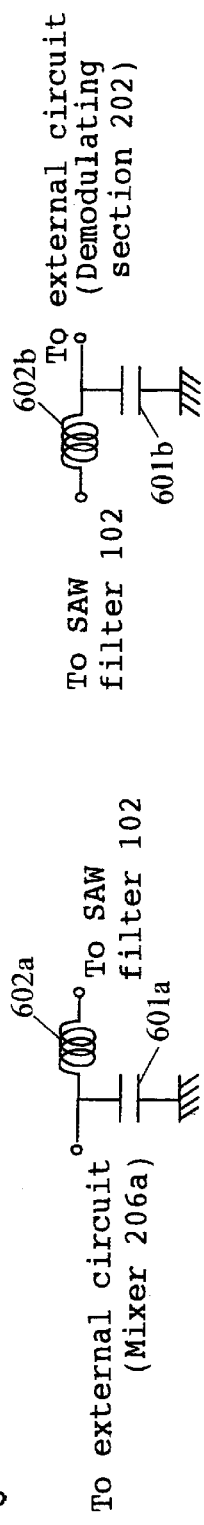
FIG. 6 is an illustration showing impedance-matching circuits of the embodiment 2 of a surface-acoustic-wave filter of the present invention.
Figure 6:
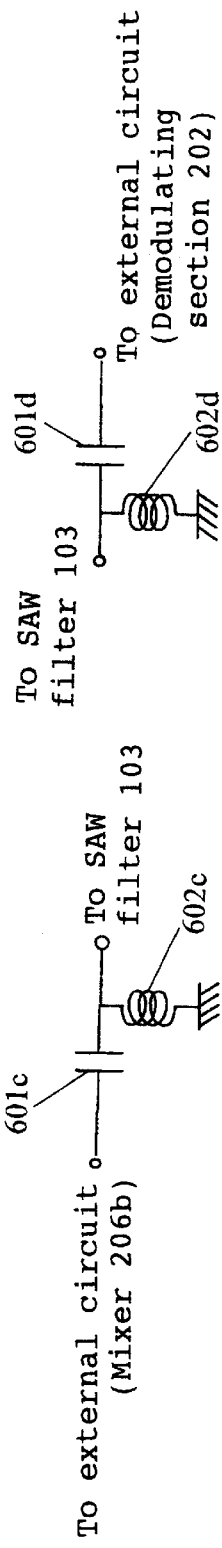

FIG. 6 shows specific configurations of the impedance-matching circuits 501a, 502a, 501b, and 502b. As shown in FIG. 6, the impedance-matching circuits 501a and 502a are such that connection sides with external circuits are grounded through capacitors 601a and 601b and connection sides with the transversal SAW filter 102 is connected in series with coils 602a and 602b. Moreover, the impedance-matching circuits 501b and 502b are such that connection sides with the transversal SAW filter 103 are grounded through coils 602c and 602d and connection sides with external circuits are connected in series with capacitors 601c and 601d.

In the case of the surface-acoustic-wave filter of this embodiment having the above impedance-matching circuits, because configurations of the impedance-matching circuits are different from each other, it is possible to provide a group delay time difference for IF signals "a" and "b" output from the transversal SAW filters 102 and 103 to the demodulating section and thereby, the same advantage as the embodiment 1 can be obtained.

This embodiment 2 is described by assuming that the impedance-matching circuits 501a, 502a, 501b, and 502b have the configurations shown in FIG. 6. These configurations are not restricted to FIG. 6.

Moreover, for this embodiment 2, it is permitted to use conventional transversal SAW filters 707a and 707b having a delay output effect instead of the transversal SAW filters 102 and 103 described for the embodiment 1. When using the filters of the embodiment 1, an advantage is obtained that a group delay time can be increased or precisely adjusted compared to a conventional case.

The embodiment 2 is described by assuming that a CDMA receiving circuit has two systems of reception circuits. However, when the receiving circuit has three receiving systems or more, it is possible to provide a group delay time difference for the reception signal of each system by forming transversal SAW filters equal to the number of systems and making configurations of impedance-matching circuits to be connected with the SAW filters different from each other.

Moreover, the embodiment 2 is described by assuming that a surface-acoustic-wave filter for performing filtering uses a transversal SAW filter. However, the same advantage can be obtained also by using another type of filter such as a coaxial filter or dielectric laminated filter.

Furthermore, it is possible to realize a more compact communication unit by mounting the surface-acoustic-wave filter described for the embodiment 2 on a communication unit.

Furthermore, each embodiment is described by assuming that a piezoelectric substrate of the present invention uses a single-crystal piezoelectric substrate. However, it is also permitted to use polycrystal or semiconductor for the piezoelectric substrate. It is permitted to use any piezoelectric substrate as long as the substrate can transfer a surface acoustic wave.

As described above, according to the present invention, RAKE reception of a CDMA receiving circuit can be realized without using a single delay unit. Therefore, it is possible to easily downsize the CDMA receiving circuit.

What is claimed is:

1. A surface-acoustic-wave filter, comprising:

a piezoelectric substrate; and a plurality of transversal surface-acoustic-wave (SAW) filters set on the piezoelectric substrate and respectively having at least two inter-digital transducer (IDT) electrodes for transceiving surface acoustic waves, wherein time periods for surface acoustic waves to propagate from inputs to outputs of the SAW filters differ in the SAW filters and thereby, timings of outputs from the SAW filters are different from each other, and each of the plurality of SAW filters includes input terminals for providing an individual input signal.

2. The surface-acoustic-wave filter according to claim 1, wherein states of SAW propagation paths in which surface acoustic waves are transferred between the IDT electrodes differ in the SAW filters and timings of outputs from the SAW filters are different from each other.

3. The surface-acoustic-wave filter according to claim 2, wherein the difference between states of the SAW propagation paths is caused by the distance between IDT electrodes of each of the transversal SAW filters (SAW propagation distance) is different from the SAW propagation distance of another of the SAW filters.

4. The surface-acoustic-wave filter according to claim 3, wherein the difference between states of the SAW propagation paths is caused by the propagation speed of a surface-acoustic-wave in a propagation path between IDT electrodes of each of the transversal SAW filters being different from the propagation speed of another of the SAW filters.

5. The surface-acoustic-wave filter according to claim 2, wherein the difference between states of the SAW propagation paths is caused by the fact that the propagation speed of a surface acoustic wave in a propagation path between IDT electrodes of each of the transversal SAW filters, being different from the propagation speed of another of the SAW filters.

6. The surface-acoustic-wave filter according to claim 5, wherein the difference between propagation speeds of the SAW propagation paths is caused by a strip electrode set between the input-side IDT electrode and the output-side IDT electrode of the transversal SAW filter.

7. The surface-acoustic-wave filter according to claim 6, wherein the shape of the strip electrode differs from one transversal SAW filter to another.

8. The surface-acoustic-wave filter according to claim 5, wherein the difference between propagation speeds in each of the SAW propagation paths is caused by a metallic film set between the input-side IDT electrode and the output-side IDT electrode of at least one of the transversal SAW filters.

9. A surface-acoustic-wave filter comprising:

a piezoelectric substrate; and a plurality of transversal surface-acoustic-wave (SAW) filters set on the piezoelectric substrate and; respectively having at least two inter-digital transducer (IDT) electrodes for transceiving surface acoustic waves, wherein time periods for surface-acoustic-waves to propagate from inputs to outputs of the SAW filters differ in the SAW filters and thereby, timings of outputs from the SAW filters are different from each other, and the transversal SAW filters are formed on piezoelectric substrates different from each other in propagation speed.

10. The surface-acoustic-wave filter according to any one of claims 1 to 9, wherein the transversal SAW filters are formed in a single package.

11. The surface-acoustic-wave filter according to any one of claims 1 to 9, wherein the transversal SAW filters substantially have the same frequency characteristic.

12. The surface-acoustic-wave filter according to any one of claims 1 to 9, wherein the transversal SAW filters substantially have the same weighting function.

13. The surface-acoustic-wave filter according to any one of claims 1 to 9 including a communication unit using a CMDA mode and comprising:

receiving means having a plurality of antennas, a plurality of mixers for converting signals sent from the antennas into IF signals, the plurality of filters for passing the IF signals, and a demodulating section for demodulating the IF signals.

14. The surface-acoustic-wave filter of claim 1 wherein an input IDT of one SAW filter is separated from an input IDT of another SAW filter.

15. The surface-acoustic-wave filter of claim 14 wherein each of the plurality of SAW filters includes output terminals for providing an individual output signal.

16. A surface-acoustic-wave filter comprising:

a piezoelectric substrate; and a plurality of transversal surface-acoustic-wave (SAW) filters set on the piezoelectric substrate and respectively having at least two inter-digital transducer (IDT) electrodes for transceiving surface-acoustic-waves, wherein time periods for surface acoustic waves to propagate from inputs to outputs of the SAW filters differ in the SAW filters and thereby, timings of outputs from the SAW filters are different from each other; and a plurality of impedance-matching circuits connected to input sides and output sides of the filters, output timings of the impedance-matching circuits of the filters are different from each other.

* * * * *